(12) United States Patent
Schindler et al.

(10) Patent No.: US 6,346,424 B1
(45) Date of Patent: Feb. 12, 2002

(54) PROCESS FOR PRODUCING HIGH-EPSILON DIELECTRIC LAYER OR FERROELECTRIC LAYER

(75) Inventors: Günther Schindler; Walter Hartner; Rainer Bruchhaus; Robert Primig, all of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/282,094

(22) Filed: Mar. 30, 1999

Related U.S. Application Data

(63) Continuation of application No. PCT/DE97/02131, filed on Sep. 19, 1997.

(30) Foreign Application Priority Data

Sep. 30, 1996 (DE) ......................................... 196 40 241

(51) Int. Cl.[7] .............................................. H01L 21/00

(52) U.S. Cl. ........................................... 438/3; 438/240

(58) Field of Search ....................... 438/3, 240; 257/295

(56) References Cited

U.S. PATENT DOCUMENTS

| | | | | |
|---|---|---|---|---|
| 5,063,422 A | * | 11/1991 | Hillenius et al. | ........... 257/372 |
| 5,099,305 A | * | 3/1992 | Takenaka | .................... 257/295 |
| 5,943,568 A | * | 8/1999 | Fujii et al. | .................. 438/240 |

FOREIGN PATENT DOCUMENTS

| | | |
|---|---|---|
| EP | 0 380 326 A2 | 8/1990 |
| JP | 2-208937 | 8/1990 |

OTHER PUBLICATIONS

Stanley Wolf Ph.D. and Richard N. Tauber Ph.D. in Silicon Processing for the VLSI Era, vol. 1: Process Technology, Lattice Press, 1986, p. 57.*

"Deposition of extremely thin (Ba, Sr) $TiO_3$ thin films for ultra–large–scale integrated dynamic random access memory application" (Hwang et al.), 320 Applied Physics Letters, vol. 67, No. 19, New York 1995, pp. 2819–2821.

"Novel Stacked Capacitor Technology for 1 Gbit DRAMs with CVD–(Ba, Sr) $TiO_3$ thin films on a thick, storage node of Ru" (Yuuki et al.), IEDM 95, Technical Digest, pp. 115–118.

"Quasi–Epitaxial Growth of PZT thin film to fabricate capacitor suitable for 256Mb DRAM and beyond" (Yamauchi et al.), 2419 A International Conference on Solid State Devices & Materials, Aug. 21–Aug. 24, 1995, pp. 291–293.

"Comparative Study of the perovskite phase microstructure evolution and electrical properties of lead zirconate titanate thin–film capacitors annealed in oxygen and nitrogen ambients" (Chikarmane et al.), Applied Physics Letters, No. 59, Nov. 25, 1991, pp. 2850–2852.

* cited by examiner

Primary Examiner—Wael Fahmy
Assistant Examiner—William M. Brewster
(74) Attorney, Agent, or Firm—Herbert L. Lerner; Laurence A. Greenberg; Werner H. Stemer

(57) ABSTRACT

The process provides a multistage procedure, in which, in the first step the layer is sputtered at low temperature, in the second step an RTP process is carried out in an inert atmosphere at medium or high temperature, and in the third step the layer is heat treated in an atmosphere containing oxygen at low or medium temperature. The levels of heating are considerably reduced compared with conventional processes, so that when the process is being employed for producing an integrated memory cell it is possible to prevent oxidation of an underlying barrier layer.

11 Claims, 1 Drawing Sheet

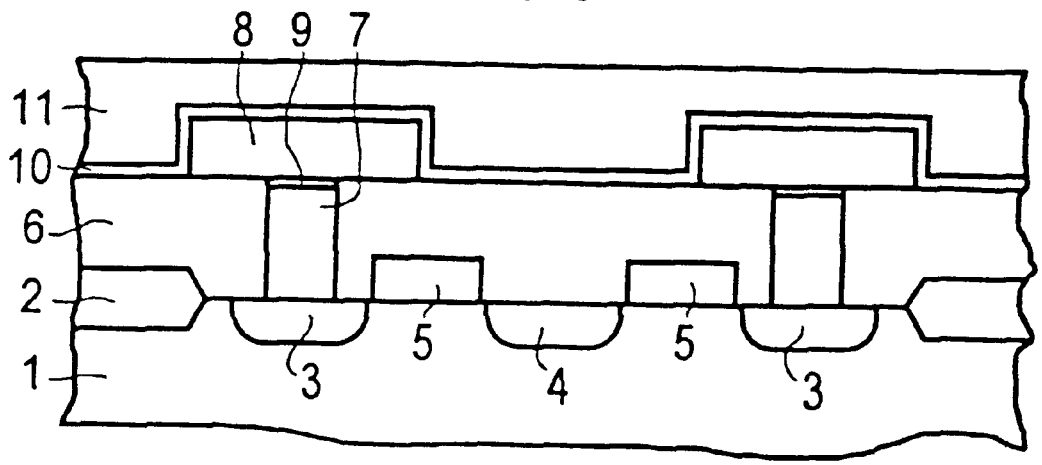
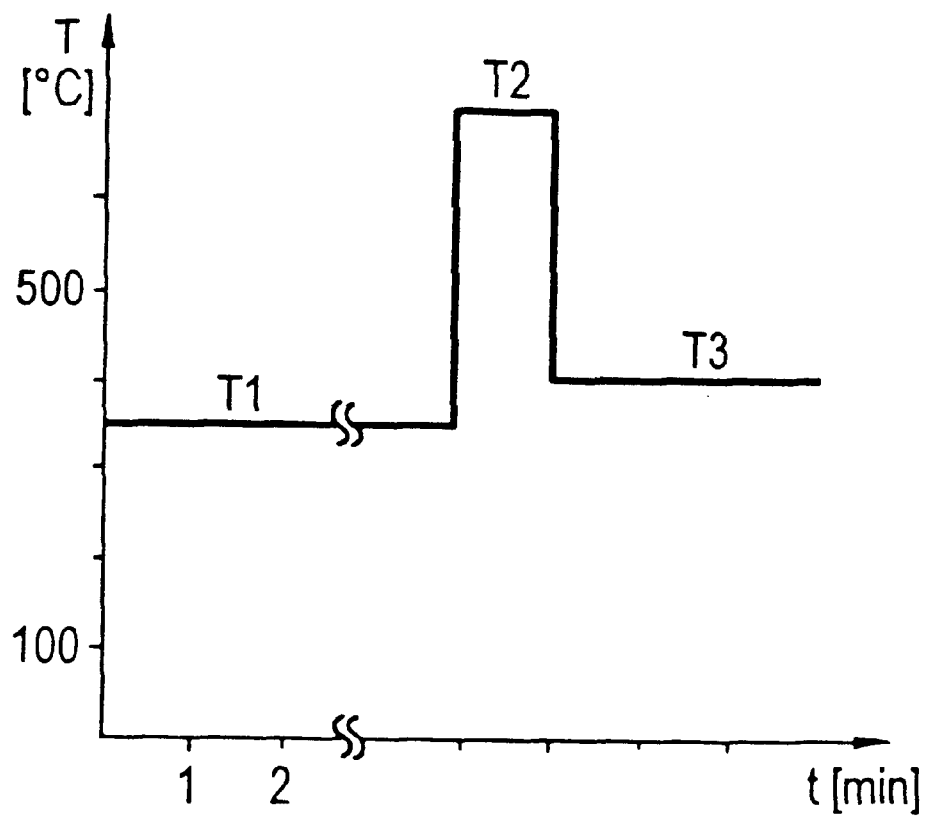

PROCESS FOR PRODUCING HIGH-EPSILON DIELECTRIC LAYER OR FERROELECTRIC LAYER

CROSS-REFERENCE TO RELATED APPLICATION

This is a continuation of copending International Application PCT/DE97/02131, filed Sep. 19, 1997, which designated the United States.

BACKGROUND OF THE INVENTION

Field of the Invention

The invention relates in general to the field of semiconductors, and specifically to a process for producing a high-e dielectric layer or a ferroelectric layer on a substrate, that is used in particular for producing an integrated semiconductor memory.

In the production of integrated circuits, high-e dielectric materials and ferroelectric materials are gaining increasing importance. They are used, for example, as the capacitor dielectric in integrated circuit memories. Because of their high dielectric constant ($\in_r$ of a few hundred), less space is needed for the storage capacitor, and because of the different polarization directions in the ferroelectric material it is possible to construct a non volatile memory called a FRAM. In a FRAM, no information is lost if the voltage supply is interrupted and no continuous refresh is required.

Examples of such materials include barium strontium titanate (BST), strontium titanate (ST), lead zirconium titanate (PZT), SBT ($SrBi_2Ta_2O_9$), and SBTN ($SrBi_2Ta_2$-$xNbxO_9$). These materials are produced by a sputtering, spin-on or deposition process which requires high temperatures ($\geq 700°$ C.) in an atmosphere containing oxygen. When used in a storage cell, which for example is constructed as a stacked capacitor, a noble metal such as platinum or ruthenium is used as the material for the first electrode since conductive materials, such as polysilicon or aluminum, that are customarily used as an electrode material oxidize under these conditions. Electrodes containing noble metals are, however, permeable to oxygen with the result that, during the production of the capacitor dielectric, deep structures become oxidized and satisfactory electrical contact between the first electrode and the selection transistor of the storage cell is not guaranteed. Prior art structures require a barrier below the capacitor dielectric that prevents oxygen from diffusing. However, these diffusion barriers can also oxidize during production of the capacitor dielectric causing the electrical connection between the first electrode and the selection transistor to be broken. In addition to the high temperature, a major cause of the oxidation is the long duration (up to 60 min) of the deposition or heat treatment.

The article by A. Yuuki et al., IEDM 95, Technical Digest, page 115, discloses a process in which the crystallization of a BST film produced in a CVD process is carried out by heat treatment in $N_2$. However, a layer produced by this process has high leakage currents.

The article by C. S. Hwang et al., Appl. Phys. Lett. 67 (1995), page 2819, describes the heat treatment of sputtered BST layers at 550° C. to 750° C. in nitrogen and oxygen. The process is not, however, suitable for the production of a storage cell since the heat treatment at these temperatures in oxygen oxidizes the barrier to such an extent that the electrical connection to the selection transistor is broken.

SUMMARY OF THE INVENTION

It is accordingly an object of the present invention to provide a process for producing a high-$\in$ dielectric layer or a ferroelectric layer using lower levels of heating.

With the foregoing and other objects in view there is provided, in accordance with the invention, a process for producing a layer on a substrate, which comprises:

selecting a layer from the group consisting of a high-e dielectric layer and a ferroelectric layer;

sputtering the layer onto a substrate at a first temperature below 500° C.;

performing an RTP step in an inert atmosphere at a second temperature in a range from 500° C. to 900° C.; and heat treating the layer in an atmosphere containing oxygen at a third temperature in a range from 200° C. to 600° C.

In accordance with an added feature of the invention, the second temperature is in a range from 600° C. to 800° C.

In accordance with an additional feature of the invention, the RTP step is performed in an atmosphere including nitrogen.

In accordance with an another feature of the invention, the the third temperature is in a range from 300° C. to 500° C.

In accordance with a further feature of the invention, the RTP step is performed in an atmosphere consisting of nitrogen.

In accordance with a further added feature of the invention, the heat treating step is performed for a duration of 1 to 15 minutes.

In accordance with a further additional feature of the invention, before performing the sputtering step, an integrated circuit memory cell is provided.

With the objects of the invention in view, there is also provided a process for producing a layer on a substrate which comprises:

selecting a layer from the group consisting of a high-e dielectric layer and a ferroelectric layer;

sputtering the layer onto a substrate at a first temperature below 500° C.;

performing an RTP step in an inert atmosphere at a second temperature in a range from 500° C. to 900° C.; and heat treating the layer in an atmosphere selected from the group consisting of oxygen and air, at a third temperature in a range of 200° C. to 600° C. for a duration of 1 to 15 minutes.

In the invention, a multistage procedure having at least three steps is used in order to prevent oxidation of the barrier. In the first step, the layer is sputtered at a low substrate temperature ($T_1 < 500°$ C.). However, the layer obtained in this way is not crystalline or has a very small grain size. This results in a very low $\in$. The second step is an RTP step (Rapid Thermal Processing) at a medium to a high temperature (T2: 500 to 900° C., preferably 600 to 800° C.) in an inert atmosphere that does not contain any oxygen. A nitrogen atmosphere, Ar or an Ar/$N_2$ mixture are particularly suitable. The $N_2$ atmosphere prevents oxidation of the barrier since all of the oxygen is bound in the layer. After this step, the layer has a high $\in$, but nevertheless has high leakage currents that are attributable to oxygen vacancies in the layer. In the third step, a heat after-treatment is carried out at a low or a medium temperature (T3: 200 to 600° C., preferably 300 to 500° C.) in an atmosphere containing oxygen. During this step, oxygen is added to the layer and the leakage currents are reduced by several orders of magnitude. Performance of this step causes $\in$ to decrease only slightly. The duration of the heat after-treatment may be up to 1 hour, but is typically 1 to 15 min. To prevent oxidation of the barrier, the temperature of this procedural step should not be too high.

Other features which are considered as characteristic for the invention are set forth in the appended claims.

Although the invention is illustrated and described herein as embodied in a process for producing a high-∈ dielectric layer or ferroelectric layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross section of a storage cell of an integrated semiconductor circuit, in which the process can be used, FIG. 2 is a temperature/time diagram of an illustrative embodiment of the invention.

DESCRIPTION OF THE PREFERRED EMBODIMENTS

FIG. 1 is used to illustrate an application of the method according to the invention. FIG. 1 shows a stacked cell having a DRAM memory cell with a capacitor configured above a selection transistor. A silicon substrate 1 with a MOS transistor can be seen. The MOS transistor includes two doped regions 3, 4 and an insulated gate 5 applied on the substrate. Inactive regions of the circuit are covered with insulation 2. An insulation layer 6 covers the transistor, and a connection 7 to the doped region 3 is provided. A connection to the doped region 4 is provided, however, it cannot be seen in the plane of the cross section. The connection 7 may be formed by etching a contact hole in the insulation layer 6, and by filling the contact hole with polysilicon or tungsten, for example. Next, using a known process, a diffusion barrier 9 made of tungsten nitride, WTiN, TiN, TaN, or another suitable material is applied having a layer thickness of 30 nm, for example. The diffusion barrier 9 is applied so that at least the entire exposed surface of the connection 7 is covered. After this step, a first electrode 8 is applied, for example by sputtering or MOCVD of a platinum layer, and is suitably structured. The diffusion barrier may also be configured on the electrode 8, or the electrode 8 may be formed from the barrier material. The configuration fabricated so far with elements 1–9 is ready for the application of the high-∈ dielectric layer or the ferroelectric layer. A BST layer, for example, is then applied as a capacitor dielectric 10 on the substrate and/or on the electrode 8.

A three-stage procedure is used to apply the capacitor dielectric 10. In the first step, a high-∈ dielectric layer or a ferroelectric layer, BST, for example, is sputtered at a substrate temperature that is below 500° C., and is preferably not greater than 350° C. to create a layer thickness of about 10–200 nm. The substrate 1 and the BST layer deposited on it are only heated to the temperature T1 ($T_1 < 500°$ C.) during the sputtering. The BST deposited by this procedure is, however, not yet crystalline or has a very small grain size. After the sputtering, the BST is crystallized in a second step by an RTP process, preferably in a nitrogen atmosphere. A nitrogen atmosphere, Ar or an $Ar/N_2$ mixture are particularly suitable. The preferred temperature during this step is about 700° C., and the preferred duration is about 60 seconds. It should be noted that the temperature during this step can be in the range of 500° C. to 900° C., and is preferably in the range of 600° C. to 800° C. Oxidation of the barrier 9 is prevented by the nitrogen atmosphere. After this, the third step which is of decisive importance for the function of the BST layer is carried out, namely heat after-treatment preferably, for about 3 min at about 400° C. in air, oxygen or an $O_2/N_2$ mixture. During this step oxygen is added to the BST and leakage currents are reduced by several orders of magnitude. The O2 partial pressure has an effect on the quality of the BST. It should be noted that the temperature during this third step can be in the range of 200° C. to 600° C., with a preferred smaller range of 300° C. to 500° C. The duration of the heat after-treatment may be up to 1 hour, but is typically 1 to 15 min.

Using the described configuration and the described multistage procedure, BST layers with $\in > 200$ and leakage currents of about 10-8 $A/cm^2$ can be produced. Finally, the storage cell is completed by producing the second electrode 11, for example using platinum.

FIG. 2 shows the temperature/time diagram of the production process that has been described with reference to FIG. 1.

We claim:

1. A process for producing a layer on a substrate, which comprises:
    selecting a layer from the group consisting of a high-e dielectric layer and a ferroelectric layer;
    sputtering the layer onto a substrate at a first temperature below 500° C.;
    performing an RTP step in an inert atmosphere at a second temperature in a range from 500° C. to 900° C.; and
    heat treating the layer in an atmosphere containing oxygen at a third temperature in a range from 200° C. to 600° C.

2. The process according to claim 1, wherein the second temperature is in a range from 600° C. to 800° C.

3. The process according to claim 2, which comprises performing the RTP step in an atmosphere including nitrogen.

4. The process according to claim 2, wherein the third temperature is in a range from 300° C. to 500° C.

5. The process according to claim 4, which comprises performing the RTP step in an atmosphere including nitrogen.

6. The process according to claim 1, wherein the third temperature is in a range from 300° C. to 500° C.

7. The process according to claim 1, which comprises performing the RTP step in an atmosphere including nitrogen.

8. The process according to claim 1, which comprises performing the RTP step in an atmosphere consisting of nitrogen.

9. The process according to claim 1, wherein the heat treating step is performed for a duration of 1 to 15 minutes.

10. The process according to claim 1, which further comprises:
    before performing the sputtering step, providing an integrated circuit memory cell.

11. A process for producing a layer on a substrate, which comprises:
    selecting a layer from the group consisting of a high-e dielectric layer and a ferroelectric layer;
    sputtering the layer onto a substrate at a first temperature below 500° C.;
    performing an RTP step in an inert atmosphere at a second temperature in a range from 500° C. to 900° C.; and
    heat treating the layer in an atmosphere selected from the group consisting of oxygen and air, at a third temperature in a range of 200° C. to 600° C. for a duration of 1 to 15 minutes.

* * * * *